United States Patent [19]

Istomin et al.

[11] 4,084,076
[45] Apr. 11, 1978

[54] ELECTRON BEAM WELDING GUN

[76] Inventors: Evgeny Ivanovich Istomin, ulitsa Oktyabrskoi revoljutsii, 22/7, kv. 20; Leonid Pavlovich Strekal, ulitsa Gorkogo, 138, kv. 8; Alexandr Fedorovich Ivanenko, ulitsa Zodchikh, 62, kv. 339; Adolf Alfonsovich Vasiliev, ulitsa Erevanskaya, 8a, kv. 36; Leonid Ignatievich Zhivaga, pereulok Dovatora, 3, kv. 1; Oleg Kuzmich Nazarenko, ulitsa Sapernoe pole, 28, kv. 27; Igor Antonovich Porazhinsky, Rusanovskaya naberezhnaya, 24/51, kv. 46; Jury Nikolaevich Zhdanov, ulitsa Krasnoarmeiskaya, 114, kv. 240, all of Kiev, U.S.S.R.

[21] Appl. No.: 795,506

[22] Filed: May 10, 1977

[51] Int. Cl.² .............................................. B23K 9/00
[52] U.S. Cl. ............................................. 219/121 EB
[58] Field of Search ...................... 313/22, 23, 24, 39; 219/121 EB, 121 EM

[56] References Cited

U.S. PATENT DOCUMENTS

| | | | |
|---|---|---|---|
| 3,268,758 | 8/1966 | Flowers | 219/121 EB |
| 3,374,523 | 3/1968 | LaRue | 313/22 X |
| 3,414,702 | 12/1968 | Stauffer | 219/121 EB |
| 3,648,015 | 3/1972 | Fairbain | 219/121 EB |

*Primary Examiner*—J. V. Truhe
*Assistant Examiner*—Fred E. Bell
*Attorney, Agent, or Firm*—Fleit & Jacobson

[57] ABSTRACT

Disclosure is made of an electron beam welding gun, wherein an anode unit is connected to a cathode unit having a sealed housing, in which there is arranged a cathode assembly. Said cathode assembly comprises a high voltage tubular insulator, whereupon there are mounted sealed leads. The inside of said sealed housing is filled with a liquid dielectric and cooled by a cooler. At least part of the outer surface of the high-voltage tubular insulator is part of the surface of the sealed housing's internal cavity.

10 Claims, 3 Drawing Figures

ELECTRON BEAM WELDING GUN

An electron beam welding gun is intended to shape an electron beam with predetermined parameters and control the power of the beam and its position relative to the weld joint. The process of evolving electron beam welding guns saw the solution of a number of important problems which could not have been solved before accelerated electron beam came to be used for welding purposes. Without reviewing the historical aspects of this process, it must be pointed out that today experts in this field. distinguish some strictly defined types of electron-optical systems of welding guns.

The most commonly used are electron beam welding guns with combined (electrostatic and electromagnetic) focusing at low or medium accelerating voltage (25 to 50 KV) and beam currents of up to 1 ampere.

Guns of this type can perform a host of different operations ranging from welding microcoponents of radioelectronic equipment to welding large-size parts with bead thicknesses of up to 100 mm.

The progress in electron beam technology has brought about certain requirements which electron beam guns are expected to meet. The most important requirements include the following:

trouble-free operation throughout the time between repairs;

reproducibility of parameters after replacing some components, such as cathodes, heaters, etc.;

fast replacement of individual components, or fast readjustment of the electron-optical system as a whole;

high versatility;

a minimum possible size.

Electron beam welding guns operate under specific conditions which include the effects of vaporising the material being welded, difficulties involved in the heat removal in vacuum, and the presence of ionizing radiation which is conducive to breakdowns of high-voltage insulation and arc-overs in vacuum insulation gaps. Such specific conditions make it extremely hard to evolvewelding equipment which could fully meet the above requirements.

There is commonly known an electron beam welding gun, wherein the cathode assembly is hermetically mounted, on a high-voltage tubular partition insulator mounted, in turn, on a water-cooled flange. At the lower portion of the water-cooled flange there are secured the anode and electromagnetic focusing and deflection systems.

The known electron beam welding gun under review has the following disadvantages:

the low electric strength of the cathode assembly in proximity to the high-voltage insulator, especially at the points of connection of the gun's high-voltage power cable, due to the high thermal saturation temperature which, in turn, is due to limited heat removal;

the relatively great length of the cathode assembly, which is a way to avoid overheating of this assembly in vacuum with limited heat removal;

the low heat input of the electron beam welding gun, which reduces its sphere of application (an accelerating voltage of up to 25KV, and the beam current of up to 200 ma.

There is known an electron beam welding gun, wherein the cathode assembly is mounted on a high-voltage tubular insulator mounted, in turn, on a water-cooled flange. On top of the water-cooled flange there is mounted the anode. The electromagnetic focusing and deflection systems are arranged below the water-cooled flange in a special sealed housing which seals the drift space of the channel. The sealed housing of the electromagnetic focusing and deflection systems ends with a water-cooled flange with the aid of which the electron beam welding gun is mounted on the vacuum chamber of the welding installation. The high-voltage power cable of the cathode assembly extends through a protective jacket which protects the personnel from accidental contact with the high-voltage leads of the cathode assembly.

The latter type of electron beam welding gun is marked by the same drawbacks as the one described above, since it lacks means to cool the high-voltage insulator and current leads of the cathode assembly.

There is further known an electron beam welding gun, wherein the cathode assembly is mounted on a high-voltage partition insulator mounted, in turn, on the upper flange of a cylinder-shaped metal housing. On the lower flange of the cylinder-shaped housing there is mounted another partition insulator. At the upper portion of the second insulator there is mounted the anode, whereas at its lower portion there are arranged water-cooled electromagnetic focusing and deflection systems.

This type of electron beam welding gun has the following disadvantages:

the low electric strength of the cathode assembly in the vicinity of the high-voltage insulator, especially at places of connection of the gun's high-voltage power cable, due to the high thermal saturation temperature of this assembly, which, in turn, is due to the limited heat removal;

the relatively great length of the gun's cathode assembly, which is a way to avoid overheating of the cathode assembly in vacuum with the limited heat removal, as well as great deformations of the cathode assembly, which, as a rule, make it necessary to resort to mechanical adjustment of the cathode assembly in relation to the anode assembly;

the relatively great size of the electron beam welding gun.

It is an object of the present invention to eliminate the above disadvantages.

It is another object of the invention to provide an electron beam welding gun marked by a high electric strength of the cathode unit, especially of its high-voltage insulator and places of connection of the gun's high-voltage power cable to the leads of the cathode assembly, as well as a high stability of parameters of the electron beam in the course of long-term service, high reliability, a minimum possible size, and the absence of any adjustment (corresction) means.

The foregoing objects are attained by providing an electron beam welding gun, wherein an anode unit is connected to a cathode unit which is a housing, wherein there is arranged a cathode assembly comprising a high-voltage tubular insulator, whereupon there are mounted sealed leads of the cathode assembly, which gun is characterized, according to the invention, by that said housing is sealed, cooled by a cooler and has an internal cavity filled with a liquid dielectric, and by that at least part of the external surface of the high-voltage tubular insulator is part of the surface of the internal cavity of the sealed housing.

It is expedient that the sealed current leads of the cathode assembly should be mounted on a partition of the high-voltage tubular insulator, which seals the vacuum, cavity of the cathode assembly.

It is advisable that the cooler for cooling the internal cavity of the housing should be constructed as a tubular cylindrical coil arranged inside the sealed housing, around the high-voltage tubular insulator.

It is equally advisable that the cooler for cooling the internal cavity of the housing should be constructed as a flat tubular coil arranged inside the sealed housing, above the high-voltage tubular insulator.

It is also possible that the function of the cooler for cooling the internal cavity of the housing should be performed by the housing's walls and bottom which should be hollow and ensure simultaneous cooling of the place of connection of the anode and cathode units.

It is preferable that the external surface of the high-voltage tubular insulator should be provided with ribs to intensify its cooling and raise its electric strength.

The proposed electron beam welding gun has the following advantages, as compared to the known gun manufactured by Sciaky Company:

a high electric strength of the cathode assembly in proximity to the high-voltage insulator, especially at places of connection of the gun's high-voltage power cable to the leads of the cathode unit;

a greater stability of parameters of the electron beam in the course of long-term service;

an increased reliability;

a complete absence of any adjustment (correction) means which are totally unnecessary;

a smaller size.

Other objects and advantages of the present invention will be more readily understood from the following detailed description of preferred embodiments thereof to be read in conjunction with the accompanying drawings, wherein.

Figure 1:
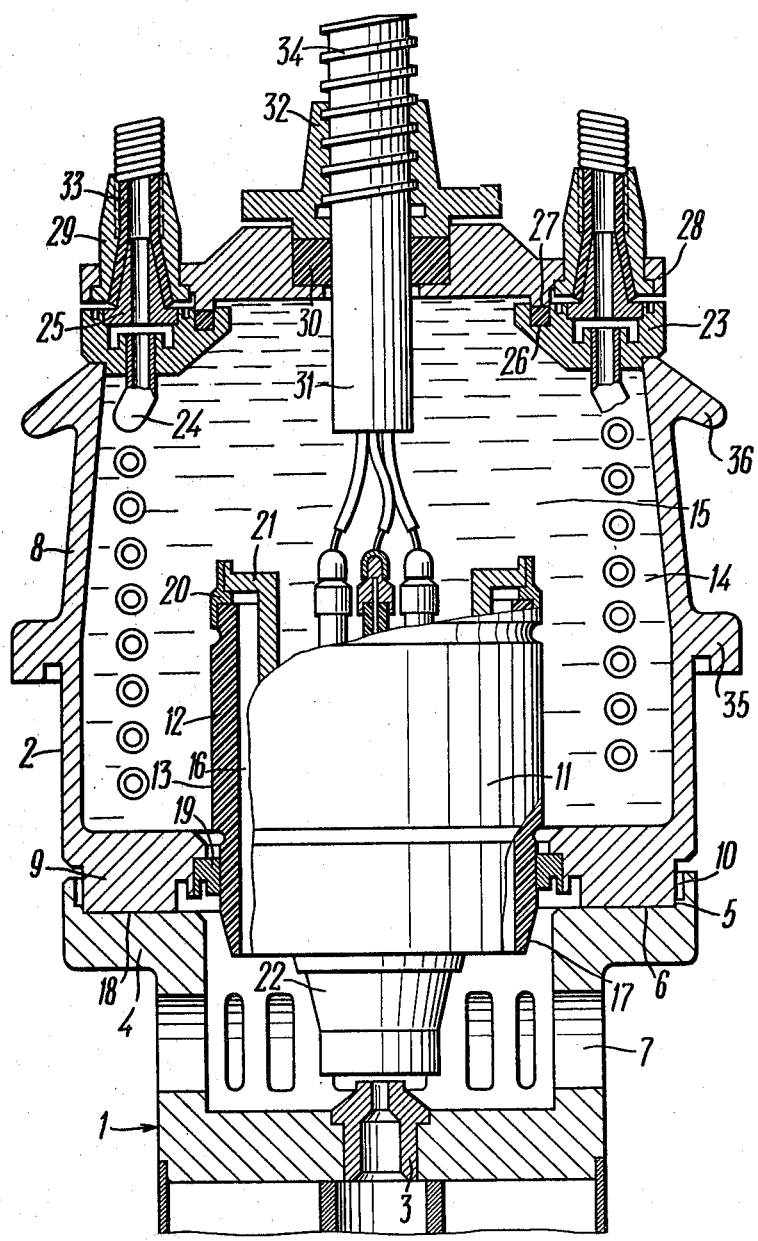
FIG. 1 is a general sectional view of the proposed electron beam welding gun with the high-voltage power cable extending along the axis of the gun, and a view of an embodiment of the cooler.

Referring now to the attached drawings, the electron beam welding gun in accordance with the present invention comprises an anode unit 1 (FIG. 1) connected to a cathode unit 2. The anode unit 1 includes an anode 3 and electromagnetic focusing and deflection systems (not shown) arranged in a housing 4 of the anode unit 1, coaxially with the anode 3. In order to ensure coaxial arrangement of the anode and cathode units, which is necessary for normal operation of the electron beam welding gun, the housing 4 of the anode unit 1 has a seat 5 which is a cylinder-shaped band arranged coaxially with the anode 3. To rule out misalignment of the anode and cathode units (1 and 2, respectively), the housing 4 of the anode unit 1 is provided with an end face plane 6 arranged at a perpendicular to the axis of the anode 3. The housing 4 of the anode unit 1 is also provided with holes 7 for evacuation of the cathode unit 2.

The cathode unit 2 comprises a sealed housing 8 whose bottom 9 is provided with a seat 10 which is a cylinder-shaped band intended for connection to the anode unit 1.

Inside the housing 8, on the bottom 9 there is hermetically mounted a cathode assembly 11 which is coaxial with the seat 10. The cathode assembly includes a high-voltage tubular insulator 12. At least part of an external surface 13 of the high-voltage tubular insulator 12 is a part of the surface of an internal cavity 14 of the sealed housing 8 of the cathode unit 2.

In other words, at least part of the external surface 13 of the high-voltage insulator 12 of the cathode assembly 11 with the components of the cathode assembly 11 mounted thereon is washed with a liquid dielectric 15 which fills the internal cavity 14 of the sealed housing 8 of the cathode unit 2.

Electron beam welding of a number of materials, such as aluminium, is accompanied by intense vaporization of the material being welded, which results in the metallization of an internal surface 16 of the high-voltage insulator 12 of the cathode assembly 11. After some time (normally, after a few weeks of operation), this starts to reduce the electric strength of the high-voltage insulator 12 and may lead to breakdowns of the internal surface 16 of the high-voltage insulator 12.

In order to raise the electric strength of the internal surface 16 of the high-voltage insulator 12, subjected to metallization, said surface 16 is artificially increased. For this purpose, the surface 16 includes a part 17 of the external surface 13 of the high-voltage insulator 12. However, this must not affect the thermal conditions of the high-voltage insulator 12 cooled by the liquid dielectric 15. The remaining portion of the external surface 13 of the high-voltage insulator 12, which is in contact with the liquid dielectric 15 and constitutes part of the surface of the internal cavity 14 of the sealed housing 8 of the cathode unit 2, must be sufficiently large to ensure effective heat removal.

An end face plane 18 of the bottom 9 is perpendicular to the axis of the seat 10, i.e. perpendicular to the axis of the cathode assembly 11. The coaxiality of the seat 10 and the axis of the cathode assembly 11, and the perpendicular arrangement of the axis of the cathode unit 11 with respect to the end face plane 18 of the bottom 9 of the housing 8 of the cathode unit 2 account for the coaxiality of the cathode and anode units (2 and 1, respectively), which is indispensable for normal operation of the electron beam welding gun.

The above-mentioned high-voltage insulator 12, incorporated in the cathode assembly 11, may be ceramic, for example, and is hermetically connected to metal rings 19 and 20. With the aid of the ring 19, the high-voltage insulator 12 of the cathode assembly 11 is hermetically mounted of the bottom 9 of the housing 8 with due regard for the coaxiality of the cathode assembly 11 and the seat 10. Hermetically connected to the metal ring 20 is a partition 21, whereupon there are hermetically mounted current leads 22 of the cathode assembly 11.

The upper portion of the sealed housing 8 is provided with a flange 23, whereupon there is mounted a tubular cylindrical coil 24 made of a metal, for example, copper, and arranged inside the sealed housing 8, around the high-voltage tubular insulator 12. Also mounted on the flange 23 are two pipe connections 25 for the supply and removal of cooling water flowing through the coil 24. The flange 23 of the sealed housing 8 is provided with a groove 26 receiving a sealing ring 27 made, for example, of vacuum rubber. The sealed housing 8 also includes a cover 28 for sealing said housing 8. Mounted on the cover 28 are two bushings 29, a sealing ring 30 made, for example, of vacuum, rubber, a high-voltage cable 31, and a seal bushing 32.

The bushings 29 mounted on the cover 28 serve for hermetic connection of hoses 33 made, for example, of vacuum rubber, when the cover 28 is installed in place on the sealed housing 8. For operation under vacuum in the working chamber of the welding installation the hoses 33 are provided with a metal braiding of coiled wire. In order to protect the high-voltage cable 31 from mechanical damage, it is placed in a metal hose 34 secured in the seal bushing 32. The high-voltage cable 31 is hermetically mounted on the cover 28 with the aid of the seal bushing 32 and the ring 30. On the external surface of the sealed housing 8 of the cathode unit 2 there are provided two projections. The first projection 35 serves to mount the electron beam welding gun on the working chamber of the welding installation. The second projection 36 is intended to facilitate the handling of the electron beam welding gun as a whole or the cathode unit 2 taken separately.

The liquid dielectric 15, which fills the internal cavity 14 of the sealed housing 8 of the cathode unit 2, is selected so as not to react with the material of the sealing rings 27 and the insulation material of the high-voltage cable 31. The liquid dielectric 15 may be castor oil, for example.

The cathode unit 2 includes a device (not shown in FIG. 1) mounted on the cover 28, which is intended to compensate an increase in the volume of the liquid dielectric 15 due to heating. The device in question will be dealt with in greater detail below, when considering one of the alternative embodiments of the present invention.

Operation of the cathode assembly 11 of the electron beam welding gun of this invention is accompanied by the heating of the current leads 22 and the partition, 21 whereupon there are hermetically mounted the leads 22 and the high-voltage insulator 12, at least part of whose external surface 13 constitutes part of the surface of the internal cavity 14 of the sealed housing 8 of the cathode unit 2.

The liquid dielectric 15, which fills the internal cavity 14, removes the heat from the above-mentioned components of the cathode assembly 11, whereby the thermal condition of these components are substantially improved. The effectiveness of heat removal in no way affects the properties of the liquid dielectric 15, which is due to the use of a cooler whose function is performed by the tubular coil 24 arranged around the high-voltage tubular insulator 12. The cooling medium may be, for example, water.

The proposed electron beam welding gun is characterized by a high electric strength of the cathode assembly in proximity to the high-voltage insulator, especially at the places of connection of the high-voltage cable to the current leads of the caathode assembly. Other advantages of the electron beam welding gun in accordance with the invention include stable parameters of the electron beam in the course of long-term service, high reliability, complete absence of adjustment means, and a smaller size, as compared to the conventional electron beam welding guns of similar types and capacity.

Figure 2:
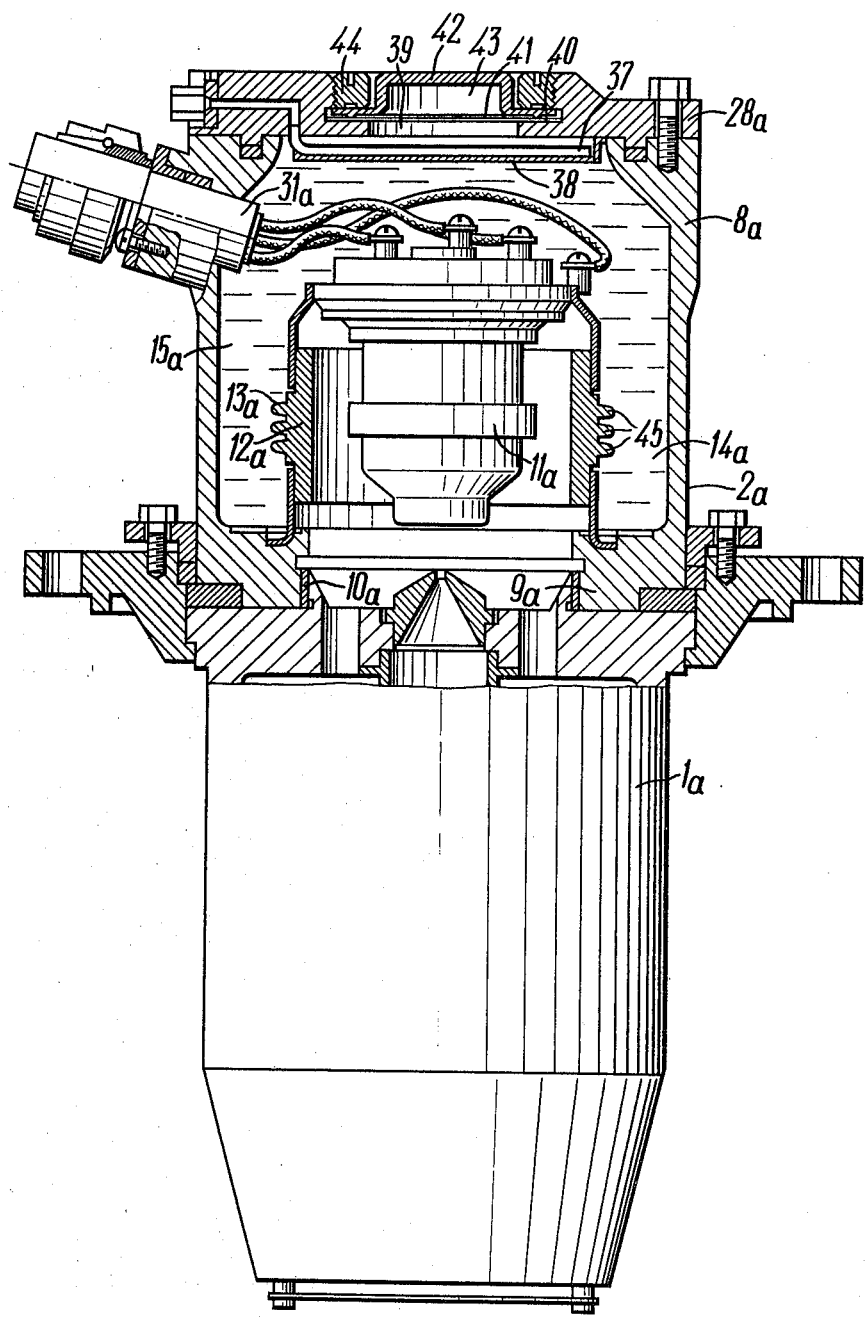
FIG. 2 is a general sectional view of the proposed electron beam welding gun with the lateral arrangement of the high-voltage power cable, and a view of an alternative embodiment of the cooler.

The electron beam welding gun of FIG. 2 differs from that of FIG. 1 by certain design features which, however, are fully within the spirit and scope of the present invention.

Consider now these different design features. The components of FIG. 2, which are similar to those of FIG. 1 and perform similar functions, have the same reference numbers with the addition of "a".

For instance, the sealed housing 8 of FIG. 1 corresponds to the sealed housing 8a of FIG. 2, etc.

On the cover 28a of the sealed housing 8a there is mounted a flat coil 37 which performs the function of a cooler and is arranged above the high-voltage insulator 12a of the cathode assembly 11a. On the side of the flat coil 37, facing the high-voltage insulator 12a, there is secured, for example, by soldering, welding, etc., a sheet 38, for example, of copper, which serves to increase the cooling surface. The function of said sheet 38 may be performed by plates or other members which can serve to develop the cooling surface. The cover 28a has a central orifice 39 whose flange 40 is provided with a rubber diaphragm 41. A cover 42 having a cavity 43 presses the rubber diaphragm 41 against the flange 40. A threaded ring 44, mounted on the cover 28a, hermetically presses the cover 42 with its cavity 43 against the flange 40. In case of an increase in the volume of the liquid dielectric 15a during operation of the cathode assembly 11a, the rubber diahragm 41 hermetically compensates the change in the volume of the liquid dielectric 15a, as it expands into the cavity 43 of the cover 42.

The cathode assembly 11a is mounted on the bottom 9a of the sealed housing 8a, coaxially with the seat 10a which serves for coaxial connection of the anode unit 1a.

The external surface 13a of the high-voltage tubular insulator 12a of the cathode assembly 11a is provided with ribs 45 to raise the electric strength of the insulator 12a and intensify the cooling thereof. In the embodiment under review, the whole of the external surface 13a of the high-voltage tubular insulator 12a is part of the surface of the internal cavity 14a of the sealed housing 8a of the cathode unit 2a.

In other words, the entire external surface 13a of the high-voltage insulator 12a of the cathode assembly 11a with the components of the cathode assembly 11a mounted thereon is washed with the liquid dielectric 15a filling the internal cavity 14a of the sealed housing 8a of the cathode unit 2a.

The foregoing design features of the electron beam welding gun of FIG. 2 permit the lateral arrangement of the high-voltage power cable 31a, which is necessitated in some cases by the overall arrangement of the gun's components. These design features also account for a certain reduction in the size of the cathode unit 2a and the gun as a whole.

Operation of the electron beam welding gun of FIG. 2 is in no way different from that of the electron beam welding gun of FIG. 1. The fact that the flat coil 37, performing the function of the cooler, is located above the high-voltage insulator 12a of the cathode assembly 11a in no way affects the welding process.

Other difference between the embodiments of FIGS. 1 and 2 are insignificant and not considered.

Figure 3:
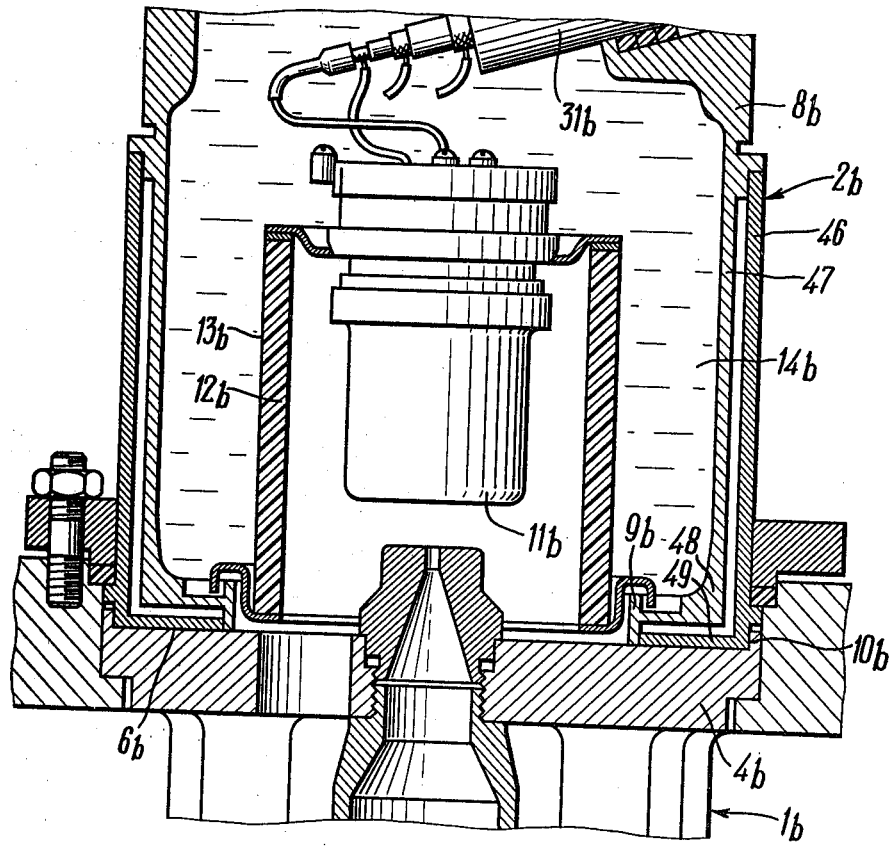
FIG. 3 is a general sectional view of the proposed electron beam welding gun with the lateral arrangement of the high-voltage power cable, and a view of another alternative embodiment of the cooler.

Another alternative embodiment of the present invention is shown in FIG. 3. The electron beams welding gun of FIG. 3 is somewhat different from those of FIGS. 1 and 2 (this applies to the gun of FIG. 2, in particular), yet these differences are totally within the spirit and scope of the invention.

The specific design features of the embodiment of FIG. 3 are described below. The components of FIG. 3, which are similar to those of FIGS. 1 and 2 and perform the same functions, have the same reference numbers with the addition of "b".

For example, the sealed housing 8 of FIG. 1 corresponds to the sealed housing 8b of FIG. 3, etc.

The sealed housing 8b of the cathode unit 2b is constructed so that double walls 46 and 47 and a double bottom 48 and 49 form a cavity which serves as a cooler. The surfaces of the walls 47 and the bottom face the internal cavity 14b of the hosuing and constitute part of that surface. The surface 49 of the bottom faces the anode unit 1b and adjoins the housing 4b of the anode unit 1b.

The cathode assembly 11b is mounted on the bottom 9b of the sealed housing 8b coaxially with the seat 10b which serves to ensure coaxial connection of the anode unit 1b.

The entire external surface 13b of the high-voltage tubular insulator 12b of the cathode assembly 11b is included in the surface of the internal cavity 14b of the sealed housing 8b of the cathode unit 2b.

The design of the electron beam welding gun of FIG. 3 is somewhat different from that of the gun of FIG. 2. In the gun of FIG. 3, the high-voltage tubular insulator 12b of the cathode assembly 11b has a simpler configuration, although it has a greater height. This configuration allows of the side arrangement of the high-voltage cable 31b, which in some cases is necessitated by the overall design of an electron beam welding gun.

In the embodiment of FIG. 3, there is no coil 37 which serves as a cooler and is mounted on the cover 28, according to the embodiment of FIG. 2. Despite some increase in the height of the high-voltage insulator 12b, this makes it possible to reduce the size of the cathode unit 2b and the size of the gun as a whole, as compared to the embodiment of FIG. 1.

Last but not least, the function of the cooler is performed by the cavity formed by the walls and bottom of the housing. This intensifies the cooling of the bottom 9b of the sealed housing 8b, which is in contact with the plane 6b of the anode unit 1b. Thus the contact of the plane 6b of the anode unit 1b with the effectively cooled bottom 9b of the sealed housing 8b of the cathode unit 2b accounts for additional cooling of the anode unit 1b, which in a number of applications makes it possible to completely dispense with the cooling of the anode unit 1.

Operation of the electron beam welding gun of FIG. 3 is in no way different from operation of the guns of FIGS. 1 and 2, except for the fact that the function of the cooler is performed by the cavity formed by the walls and bottom of the sealed housing 8b. This, however, in no way affects the welding process.

Other peculiarities of the embodiment of FIG. 3 are insignificant and not considered.

What is claimed is:

1. An electron beam welding gun comprising: an anode unit; a cathode unit connected to said anode unit and having a sealed housing whose internal cavity is filled with a liquid dielectric and cooled by a cooler; a cathode assembly arranged in said sealed housing and comprising a high-voltage tubular insulator, whereupon there are mounted sealed current leads; at least part of the external surface of said high-voltage tubular insulator forming part of the surface of said internal cavity of said sealed housing.

2. An electron beam welding gun as claimed in claim 1, wherein said sealed current leads of the cathode assembly are mounted on a partition of said high-voltage tubular insulator, which partition seals the vacuum cavity of the cathode assembly.

3. An electron beam welding gun as claimed in claim 1, wherein the coller for cooling the internal cavity of the housing is constructed as a tubular cylindrical coil arranged inside the sealed housing, around the high-voltage tubular insulator.

4. An electron beam welding gun as claimed in claim 1, wherein the cooler for cooling the internal cavity of the housing is constructed as a flat tubular coil arranged inside the sealed housing, above the high-voltage tubular insulator.

5. An electron beam welding gun as claimed in claim 1, wherein the cooler for cooling the internal cavity of the housing is formed by hollow walls and bottom of the sealed housing, which also ensures the cooling of the place of connection of the anode and cathode units.

6. An electron beam welding gun as claimed in claim 1, wherein the external surface of said high-voltage tubular insulator is provided with ribs to raise the insulator's electric strength and intensify its cooling.

7. An electron beam welding gun as claimed in claim 2, wherein the external surface of siad high-voltage tubular insulator is provided with ribs to raise the insulator's electric strength and intensify its cooling.

8. An electron beam welding gun as claimed in claim 3, wherein the external surface of said high-voltage tubular insulator is provided with ribs to raise the insulator's electric strength and intensify its cooling.

9. An electron beam welding gun as claimed in claim 4, wherein the external surface of said high-voltage tubular insulator is provided with ribs to raise the insulator's electric strength and intensify its cooling.

10. An electron beam welding gun as claimed in claim 5, wherein the external surface of said high-voltage tubular insulator is provided with ribs to raise the insulator's electric strength and intensify its cooling.

* * * * *